(12) United States Patent
Takagiwa

(10) Patent No.: US 9,754,642 B2
(45) Date of Patent: Sep. 5, 2017

(54) SEMICONDUCTOR MEMORY DEVICE

(71) Applicant: KABUSHIKI KAISHA TOSHIBA, Tokyo (JP)

(72) Inventor: Teruo Takagiwa, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/051,481

(22) Filed: Feb. 23, 2016

(65) Prior Publication Data

US 2016/0247549 A1    Aug. 25, 2016

(30) Foreign Application Priority Data

Feb. 24, 2015    (JP) ................. 2015-034095

(51) Int. Cl.

| G11C 7/10 | (2006.01) |
|---|---|
| G11C 7/06 | (2006.01) |
| G11C 16/04 | (2006.01) |
| G11C 16/10 | (2006.01) |
| G11C 16/26 | (2006.01) |
| G11C 29/00 | (2006.01) |
| G11C 29/12 | (2006.01) |
| G11C 29/44 | (2006.01) |

(52) U.S. Cl.
CPC ............. *G11C 7/106* (2013.01); *G11C 7/065* (2013.01); *G11C 7/1006* (2013.01); *G11C 7/1063* (2013.01); *G11C 7/1087* (2013.01); *G11C 16/0483* (2013.01); *G11C 16/10* (2013.01); *G11C 16/26* (2013.01); *G11C 29/76* (2013.01); *G11C 2029/1204* (2013.01); *G11C 2029/4402* (2013.01)

(58) Field of Classification Search
CPC ....... G11C 7/106; G11C 7/065; G11C 7/1006; G11C 7/1063
USPC .......................... 365/189.05, 189.08, 189.07
See application file for complete search history.

(56) References Cited

U.S. PATENT DOCUMENTS

| 4,792,924 | A | * | 12/1988 | Rubinstein | ............. | G11C 7/065 365/154 |
|---|---|---|---|---|---|---|
| 5,696,716 | A | * | 12/1997 | Rolandi | ................. | G11C 14/00 365/185.05 |
| 5,790,458 | A | * | 8/1998 | Lee | ......................... | G11C 7/067 365/185.21 |
| 5,910,921 | A | * | 6/1999 | Beffa | ...................... | G11C 29/44 365/200 |
| 6,111,785 | A | * | 8/2000 | Hirano | ...................... | G11C 8/06 365/185.09 |
| 6,845,029 | B2 | * | 1/2005 | Santin | ................ | G11C 16/0441 365/185.26 |
| 7,227,307 | B2 | * | 6/2007 | Yoo | .......................... | H01J 11/16 313/582 |

(Continued)

*Primary Examiner* — Viet Q Nguyen
(74) *Attorney, Agent, or Firm* — Patterson & Sheridan, LLP

(57) ABSTRACT

A semiconductor memory device includes a plurality of memory cells, a data bus connected to a first column of the memory cells, by which data is transferred to and from the memory cells of the first column, a data latch storing data indicating whether the first column is defective or not, and a transistor having a first terminal connected to the data bus, a second terminal connected to a voltage source, and a gate connected to an output of the data latch.

7 Claims, 8 Drawing Sheets

(56) References Cited

U.S. PATENT DOCUMENTS

| | | | |
|---|---|---|---|
| 2002/0167849 A1* | 11/2002 | Ohbayashi | G11C 29/50 |
| | | | 365/189.09 |
| 2006/0018157 A1 | 1/2006 | Kawai | |
| 2006/0050564 A1 | 3/2006 | Kojima et al. | |
| 2006/0245259 A1 | 11/2006 | Fukuda et al. | |
| 2010/0008157 A1* | 1/2010 | Honma | G11C 7/1063 |
| | | | 365/189.05 |
| 2011/0002169 A1* | 1/2011 | Li | G11C 29/808 |
| | | | 365/185.09 |
| 2012/0057419 A1* | 3/2012 | Kim | G11C 16/10 |
| | | | 365/200 |
| 2013/0329494 A1* | 12/2013 | Shirakawa | G11C 16/06 |
| | | | 365/185.09 |

\* cited by examiner

SEMICONDUCTOR MEMORY DEVICE

CROSS-REFERENCE TO RELATED APPLICATION

This application is based upon and claims the benefit of priority from Japanese Patent Application No. 2015-034095, filed Feb. 24, 2015, the entire contents of which are incorporated herein by reference.

FIELD

Embodiments described herein relate generally to a semiconductor memory device.

BACKGROUND

In a write operation of a NAND memory, a method of bringing a defective column in a non-selected state is proposed so as to not apply stress on a bit line in the defective column.

DETAILED DESCRIPTION

Figure 1:
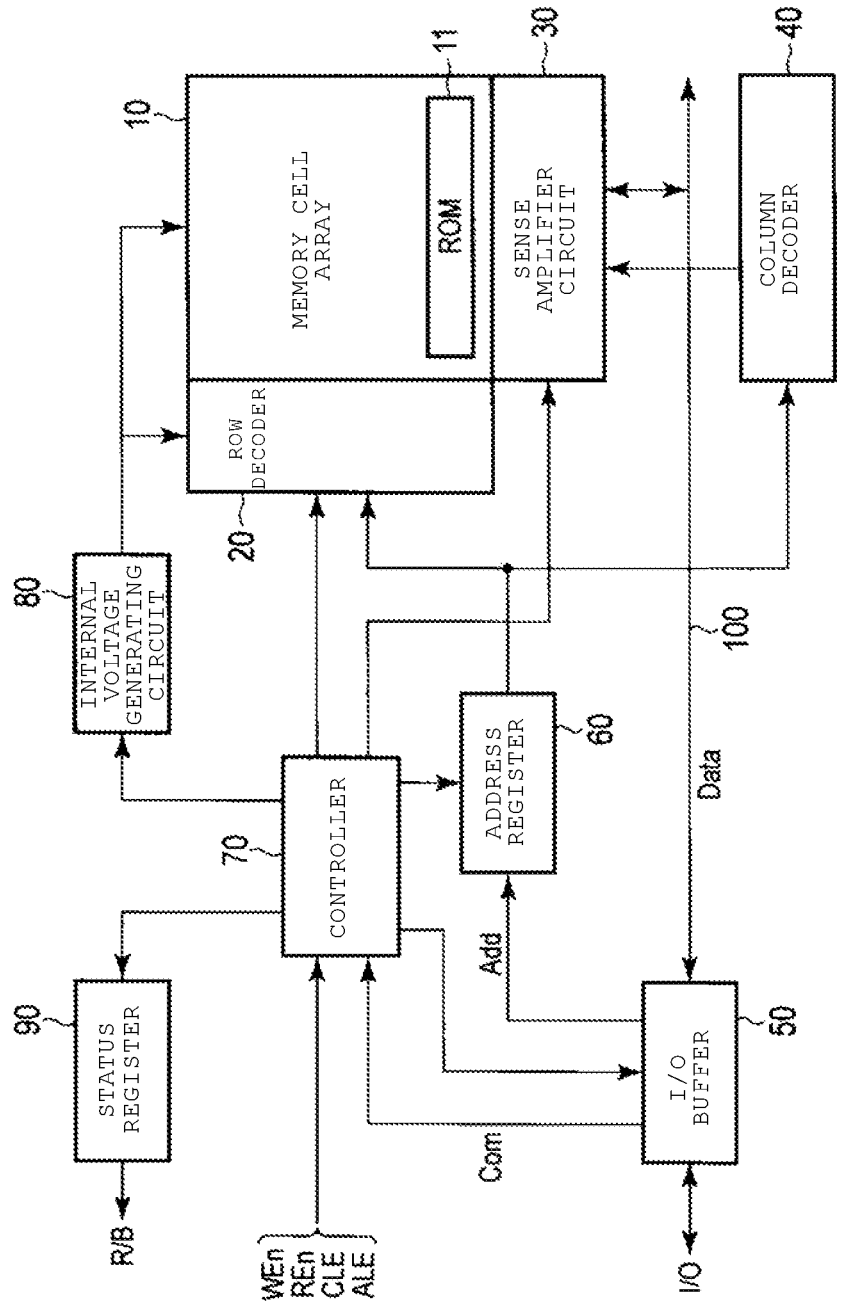
FIG. 1 is a diagram which shows a configuration of a semiconductor memory device according to a first embodiment.

Embodiments now will be described more fully hereinafter with reference to the accompanying drawings. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include plural forms as well, unless the context clearly indicates otherwise. It will be further understood that the terms "comprises," "comprising," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it may be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it may be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, such elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, when the structure in the Figure is turned over, elements described as being on the "backside" of substrate would then be oriented on "upper" surface of the substrate. The exemplary term "upper", may therefore, encompasses both an orientation of "lower" and "upper," depending on the particular orientation of the figure. Similarly, when the structure in one of the figures is turned over, elements described as "below" or "beneath" other elements would then be oriented "above" the other elements. The exemplary terms "below" or "beneath" may, therefore, encompass both an orientation of above and below.

Embodiments are described herein with reference to cross section and perspective illustrations that are schematic illustrations of the embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Embodiments provide a semiconductor memory device that increases speed while eliminating stress on a bit line in a defective column in a write operation.

According to the embodiment, a semiconductor memory device includes a plurality of memory cells, a data bus connected to a first column of the memory cells, by which data is transferred to and from the memory cells of the first column, a data latch storing data indicating whether the first column is defective or not, and a transistor having a first terminal connected to the data bus, a second terminal connected to a voltage source, and a gate connected to an output of the data latch.

Hereinafter, exemplary embodiments will be described with reference to the drawings. In the drawings, the same portion is denoted by the same reference numeral.

(First Embodiment)

A semiconductor memory device according to a first embodiment will be described using FIGS. 1 to 5.

Configurations in First Embodiment

As shown in FIG. 1, a semiconductor memory device includes a memory cell array 10, a row decoder 20, a sense amplifier circuit 30, a column decoder 40, an I/O buffer 50, an address register 60, a controller 70, an internal voltage generating circuit 80, and a status register 90.

The memory cell array 10 includes a memory region and a ROM region 11. The ROM region 11 is a region for holding, for example, defective address information, and the like. The memory region is a region for holding data written by a user.

Figure 2:
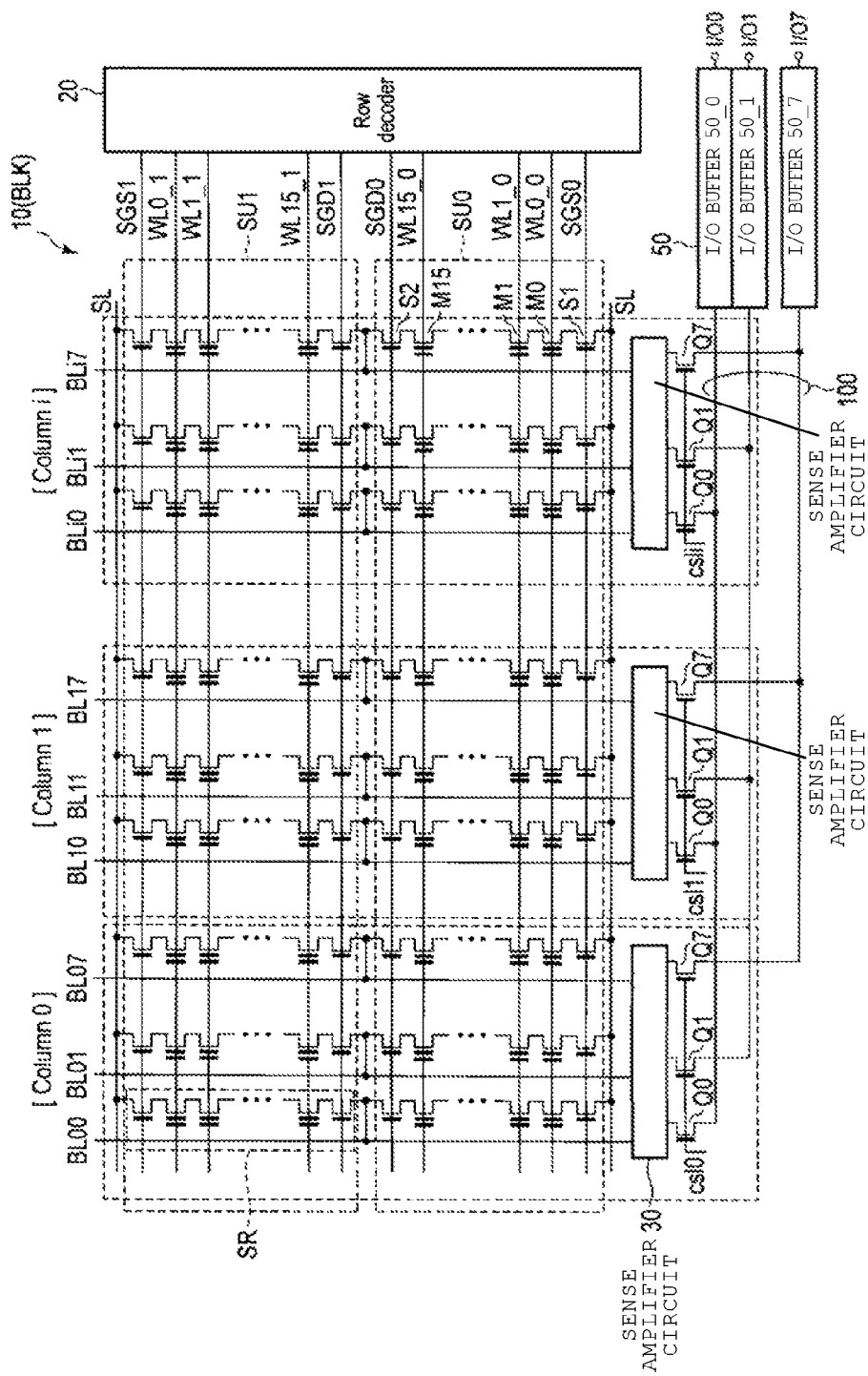
FIG. 2 is a diagram which shows a configuration of a memory cell array according to the first embodiment.

The memory region in the memory cell array 10 includes a plurality of blocks BLK, one of which is shown in FIG. 2. Each block BLK includes a plurality of string units, e.g., SU0 and SU1. In addition, each string unit includes a plurality of NAND strings SR. The plurality of NAND strings SR are arranged in a matrix form.

Each NAND string SR includes, for example, 16 memory cell transistors M0 to M15, and select transistors S1 and S2. The memory cell transistors M0 to M15 are arranged between the select transistors S1 and S2 and connected to each other in series. One of a source and a drain of the memory cell transistor M0 on an end side of this series connection is connected to one of a source and a drain of the select transistor S1. Moreover, one of a source and a drain of the memory cell transistor M15, on the other end side of the series connection, is connected to one of a source and a drain of the select transistor S2.

Gates of select transistors S2 of the string unit SU0 are commonly connected to a select gate line SGD0, and gates of select transistors S1 of the string unit SU0 are commonly connected to a select gate line SGS0. Moreover, gates of memory cell transistors Mn (0≤n≤15) of the string unit SU0 are commonly connected to a word line WLn_0.

In addition, gates of select transistors S2 of the string unit SU1 are commonly connected to a select gate line SGD1, and gates of select transistors S1 of the string unit SU1 are commonly connected to a select gate line SGS1. Moreover, gates of memory cell transistors Mn (0≤n≤15) of the string unit SU1 are commonly connected to a word line WLn_1.

The other of the source and the drain of the select transistor S1 is connected to a source line SL, and the other of the source and the drain of the select transistor S2 is connected to the bit line BL. Moreover, a plurality of adjacent bit lines BL form a column. In the example, bit lines BL00 to BL07 form a column 0, bit lines BL10 to BL17 form a column 1, and bit line BLi0 to BLi7 form a column i. Replacement of a defective column is performed on a column basis.

Data of the memory cell transistors Mn in the same block BLK are collectively erased. On the contrary, reading and writing of data are collectively performed in a plurality of memory cell transistors Mn which are commonly connected to any one word line WLn in any string unit SU of any block BLK. This unit is referred to as a "page".

The row decoder 20 selects a word line WL and select gate lines SGS and SGD according to a row address.

The sense amplifier circuit 30 is provided separately for each column. The sense amplifier circuit 30 has a data latch which is connected to the bit line BL to perform data reading and to hold written data.

Figure 3:
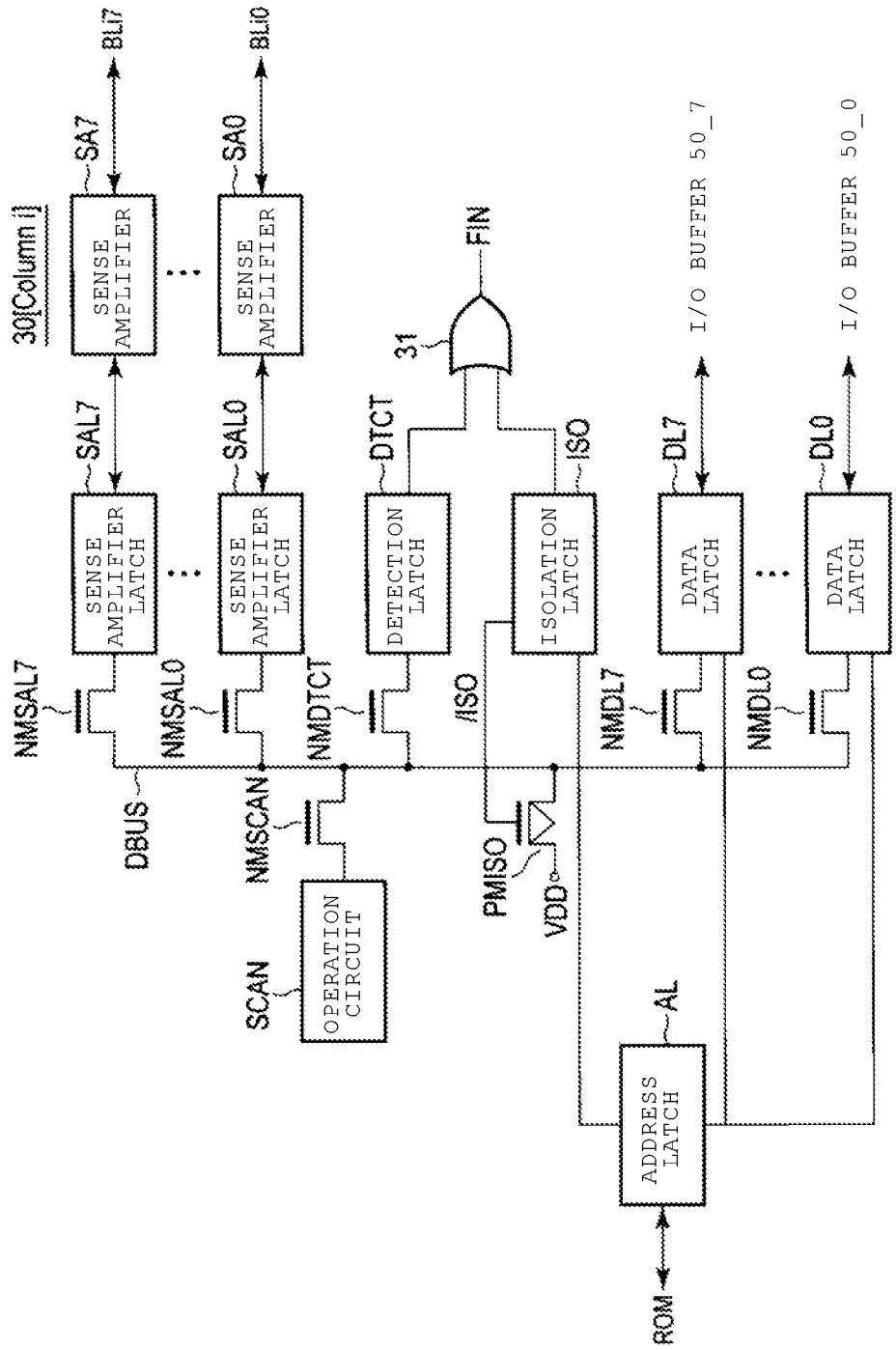
FIG. 3 is a diagram which shows a configuration of a sense amplifier circuit in each column according to the first embodiment.

In FIG. 3, the sense amplifier circuit 30 corresponding to a column i is shown.

As shown in FIG. 3, the sense amplifier circuit 30 includes data latches DL0 to DL7, an address latch AL, an isolation latch ISO, a detection latch DTCT, an operation circuit SCAN, sense amplifier latches SAL0 to SAL7, sense amplifiers SA0 to SA7, and a data bus DBUS.

A data latch DLm (0≤m≤7), a sense amplifier latch SALm, and a sense amplifier SAm are provided for the I/O buffer 50_m. On the other hand, the address latch AL, the isolation latch ISO, the detection latch DTCT, the operation circuit SCAN, and the data bus DBUS are provided for each column.

The data latch DLm is connected to the outside through the I/O buffer 50_m. In addition, the data latch DLm is connected to one of a source and a drain of an NMOS transistor NMDLm. The other of the source and the drain of the NMOS transistor NMDLm is connected to the data bus DBUS.

The sense amplifier latch SALm is connected to the data latch DLm through the data bus DBUS. Moreover, the sense amplifier latch SALm is connected to a bit line BLim through the sense amplifier SAm. The sense amplifier latch SALm is connected to one of a source and a drain of an NMOS transistor NMSALm. The other of the source and the drain of the NMOS transistor NMSALm is connected to the data bus DBUS.

The sense amplifier latch SALm does not perform writing into a memory cell when having "1 (H level)" data (also referred to as a signal or a voltage), but performs writing into the memory cell when having "0 (L level)" data. In other words, when the sense amplifier latch SALm has the "1 (H level)" data, the sense amplifier latch sets the bit line BLm to be non-selected and does not apply a write voltage.

The address latch AL performs a ROMREAD operation when the semiconductor memory device 1 is powered on. The ROMREAD operation is an operation for reading defective column information or a set voltage value stored in a ROM region 11. The address latch AL transfers defective column information to the isolation latch ISO and the data latch DL.

The isolation latch ISO stores the defective column information received from the address latch AL. The defective column information indicates whether or not a corresponding column is a defective column. The defective column includes a defective cell or a short bit line BL, and is a non-used column. The isolation latch ISO contains the "1" data when a corresponding column is a defective column, and the isolation latch ISO stores the "0" data when a corresponding column is not a defective column.

The isolation latch ISO is connected to the gate of the PMOS transistor PMISO, and outputs inverted data (signal) of defective column information /ISO to the gate. That is, the isolation latch ISO outputs the "0" data when a corresponding column is a defective column, and outputs the "1" data when a corresponding column is not a defective column.

One of a source and a drain of the PMOS transistor PMISO is connected to a power supply terminal (power supply voltage VDD). The other is connected to the data bus DBUS. When the isolation latch ISO stores the "1" data (a corresponding column is a defective column), the "0" data which is inverted data of the "1" data is input to the gate of the PMOS transistor PMISO. Accordingly, the PMOS transistor PMISO is turned on, and the PMOS transistor PMISO transfers a power supply voltage VDD ("1 (H level)" data) to the data bus DBUS.

An operation circuit SCAN performs various operations such as an AND operation, an OR operation, or an inverse operation.

In a write operation and an erase operation, the detection latch DTCT stores information which indicates whether or not the write operation and the erase operation are completed. The detection latch DTCT stores the "1" data when the write operation and the erase operation on all of the sense amplifier latches SALm are completed, and stores the "0" data when the write operation and the erase operation are not completed. The detection latch DTCT is connected to one of a source and a drain of an NMOS transistor NMDTCT. The other of the source and the drain of the NMOS transistor NMDTCT is connected to the data bus DBUS.

The isolation latch ISO is connected to a first input terminal of an OR gate 31, and the detection latch DTCT is connected to a second input terminal of the OR gate 31. The OR gate 31 performs an OR operation on a verification operation after writing, and outputs a result of the operation as a signal FIN. The OR gate 31 indicates completion of the write operation when the result of the operation is "1", and indicates that the write operation is performed again when the result of the operation is "0".

The data bus DBUS is a data line which performs connection between latches, and transfers data between the latches.

As shown in FIG. 2, a data transfer between the sense amplifier circuit 30 and the input and output terminal I/Om is performed through a data bus 100 and the I/O buffer 50_m. The sense amplifier circuit 30 is connected to a column gate circuit (transistor Qm) which is controlled by a column selection signal CSLi, and the column decoder 40 controls the column selection signal CSLi.

As shown in FIG. 1, an address Add supplied from the input and output terminal I/O is transferred to the row decoder 20 and the column decoder 40 through the address register 60. A command Com supplied from the input and output terminal I/O is decoded by the controller 70. The controller 70 performs a write operation, an erase operation, and a read operation based on the command Com and an external control signal such as a write enable signal WEn, a read enable signal REn, a command latch enable signal CLE, and an address latch enable signal ALE.

An internal voltage generating circuit 80 generates various internal voltages necessary for the write operation, the erase operation, and the read operation according to a control of the controller 70. The internal voltage generating circuit 80 uses a voltage boosting circuit so as to generate an internal voltage higher than a power supply voltage. The status register 90 outputs a status signal R/B which shows a status of the semiconductor memory device.

Operations in First Embodiment

Figure 4:
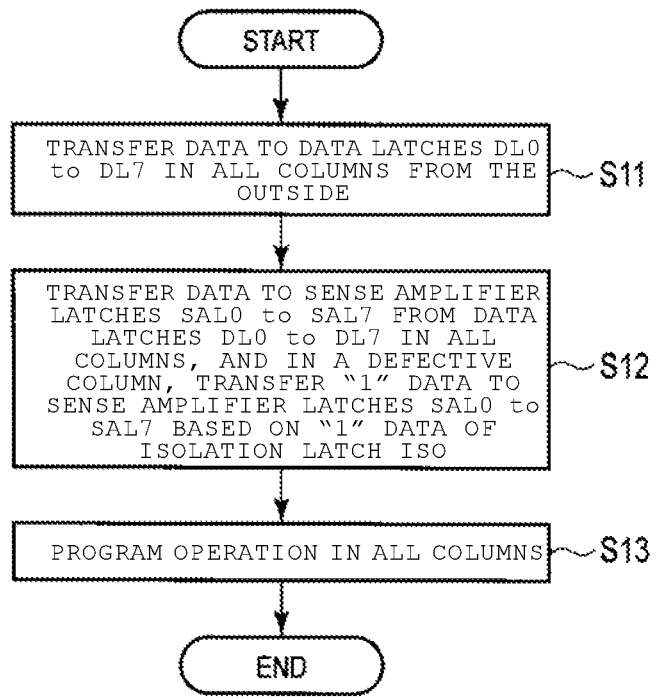
FIG. 4 is a flowchart which shows a write operation according to the first embodiment.

A flow of a write operation shown in FIG. 4 is performed by a control of the controller 70.

As shown in FIG. 4, in the write operation, first, the controller 70 transfers data to the data latch DLm in all columns from the outside through the I/O buffer 50_m in Step S11.

Next, in Step S12, the controller 70 transfers data to the sense amplifier latch SALm from the data latch DLm in all columns through the data bus DBUS. At this time, an NMOS transistor NMDLm corresponding to the data latch DLm and an NMOS transistor NMSALm corresponding to the sense amplifier latch SALm are sequentially turned on according to a control of the controller 70. More specifically, first, NMOS transistors NMDL0 and NMSAL0 are turned on, NMOS transistors NMDL1 and NMSAL1 are turned on, and finally, NMOS transistors NMDL7 and NMSAL7 are turned on.

In addition, in a defective column, the controller 70 transfers the "1" data to the sense amplifier latch SALm based on the "1" data of the isolation latch ISO at the same time as described above.

More specifically, the isolation latch ISO in a defective column outputs inverted data of defective column information /ISO to the gate of the PMOS transistor PMISO. That is, the isolation latch ISO in a defective column outputs the "0" data. Accordingly, the PMOS transistor PMISO is turned on, and the PMOS transistor PMISO transfers a power supply voltage VDD (the "1" data) to the data bus DBUS. Therefore, the "1" data is transferred to the sense amplifier latch SALm in the defective column and the sense amplifier latch SALm in the defective column is in a non-selected state.

That is, in Step S12, data from the data latch DLm are transferred to the sense amplifier latch SALm in a normal column, and on the other hand, a power supply voltage VDD (the "1" data) is transferred to the sense amplifier latch SALm in the defective column.

Thereafter, in Step S13, the controller 70 writes data in each memory cell from the sense amplifier latch SALm in all columns through the sense amplifier SAm and the bit line BLim. At this time, the sense amplifier latch SALm does not perform writing into a memory cell when storing the "1" data, but performs writing into the memory cell when storing the "0" data. The sense amplifier latch SALm in a defective column stores the "1" data, thereby not performing writing into the memory cell in the defective column.

In this manner, the write operation in the first embodiment is performed.

Although not shown, the controller 70 performs a verification operation after the write operation is ended. In the verification operation, the controller 70 transfers cell data to the sense amplifier latch SALm from the memory cell through the bit line BLim and the sense amplifier SAm. Here, "1" is stored in the sense amplifier latch SALm when writing of "0" data is completed. In addition, "0" is stored in the sense amplifier latch SALm when the writing of "0" data is not completed. In addition, writing of "1" data is not performed in the memory cell and in such cases "1" is stored in the sense amplifier latch SALm. In addition, the detection latch DTCT is reset with "1" data.

Thereafter, the controller 70 sequentially performs AND operations on data of the sense amplifier latch SALm and data of the detection latch DTCT using the operation circuit SCAN. Then, a result of the operation is stored in the detection latch DTCT.

More specifically, first, the AND operation is performed on data of a sense amplifier latch SAL0 and data of the detection latch DTCT reset to "1", and a result of the operation is stored in the detection latch DTCT. Next, the AND operation is performed on data of a sense amplifier latch SAL1 and the data of the detection latch DTCT, and a result of the operation is stored in the detection latch DTCT. Thereafter, the AND operation is performed until data of a sense amplifier latch SAL7 and the data of the detection latch DTCT, and a result of the operation is stored in the detection latch DTCT. As a result, when any of data of the sense amplifier latch SALm is "0 (not completed)", "0 (not completed)" is stored in the detection latch DTCT.

In addition, after all the AND operations have been performed, the controller 70 performs the OR operation on the data of the detection latch DTCT and data of the isolation latch ISO using the OR gate 31, and outputs a signal FIN as a result of the operation. Then, when the signals FIN in all columns are "1", the write operation is ended. When the signals FIN in all columns are not "1", the write operation is performed again.

When the write operation is performed again because not all "0" is stored in the detection latch DTCT, the data of the detection latch DTCT is reset to "1". Then, a data transfer from the data latch DLm to the sense amplifier latch SALm is not performed, the data of the sense amplifier latch SALm which are stored in advance are written in each memory cell through the sense amplifier SAm and the bit line BLim.

In the example, the "0" data is described as L level data, and the "1" data is described as H level data, but these may be reversed.

Effects in First Embodiment

Figure 5:
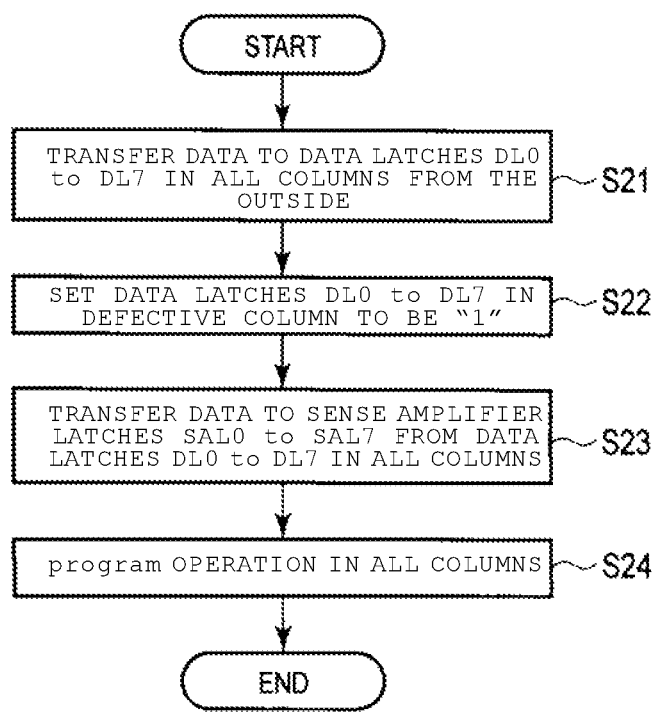
FIG. 5 is a flowchart which shows a write operation according to a comparative example.

FIG. 5 is a flowchart which shows a write operation according to a comparative example.

As shown in FIG. 5, in a write operation of the comparative example, first, the controller 70 transfers data to the data latch DLm in all columns from the outside through the I/O buffer 50_m in Step S21.

Next, in Step S22, the controller 70 sets a data latch DLm in a defective column as "1". The operation is performed by reading defective column information from a ROM to an address latch AL using the ROMREAD, and transferring defective column information from the address latch AL to the data latch DLm.

Next, in Step S23, the controller 70 transfers data from a data latch DLm to a sense amplifier latch SALm in all columns through the data bus DBUS. At this time, an NMOS transistor NMDLm corresponding to the data latch DLm and an NMOS transistor NMSALm corresponding to the sense amplifier latch SALm are sequentially turned on according to a control of the controller 70.

At this time, the "1" data is held in the data latch DLm in a defective column. For this reason, the controller 70 transfers the "1" data from the data latch DLm to the sense amplifier latch SALm in the defective column. Accordingly, the sense amplifier latch SALm in the defective column is in a non-selected state.

Thereafter, in the same manner as in the first embodiment, the controller 70 writes data in each memory cell from the sense amplifier latch SALm in all columns through the sense amplifier SAm and the bit line BLim in Step S24.

In this manner, the write operation in the comparative example is performed. The operation (the operation of transferring defective column information from the address latch AL to the data latch DLm) in Step S22 of the comparative example is performed in each I/Om (each data latch DLm), such that time for writing becomes long.

In contrast, the PMOS transistor PMISO is arranged according to the first embodiment. One of the source and the drain of the PMOS transistor PMISO is connected to the data bus DBUS, the other is connected to a power supply terminal, and the gate of the PMOS transistor is connected to the isolation latch ISO. Therefore, when a column to be written is a defective column, it is possible to turn on the PMOS transistor PMISO in response to the defective column information held by the isolation latch ISO.

Then, a power supply voltage VDD ("1" data) is transferred to the sense amplifier latch SALm through the PMOS transistor PMISO, whereby the column may be set to be in the non-selected state. That is, as shown in the comparative example, the "1" data is transferred from the address latch AL to the sense amplifier latch SALm through the data latch DLm, whereby an operation (Step S22) of setting the column to be in the non-selected state may be omitted. Accordingly, it is possible to increase speed while eliminating stress on a bit line BL in the defective column in the write operation.

(Second Embodiment)

With referring to FIGS. 6 to 8, a semiconductor memory device according to a second embodiment will be described.

In the second embodiment, description of the features that are the same as in the first embodiment is omitted, and differences will be mainly described.

Configurations in Second Embodiment

Figure 6:
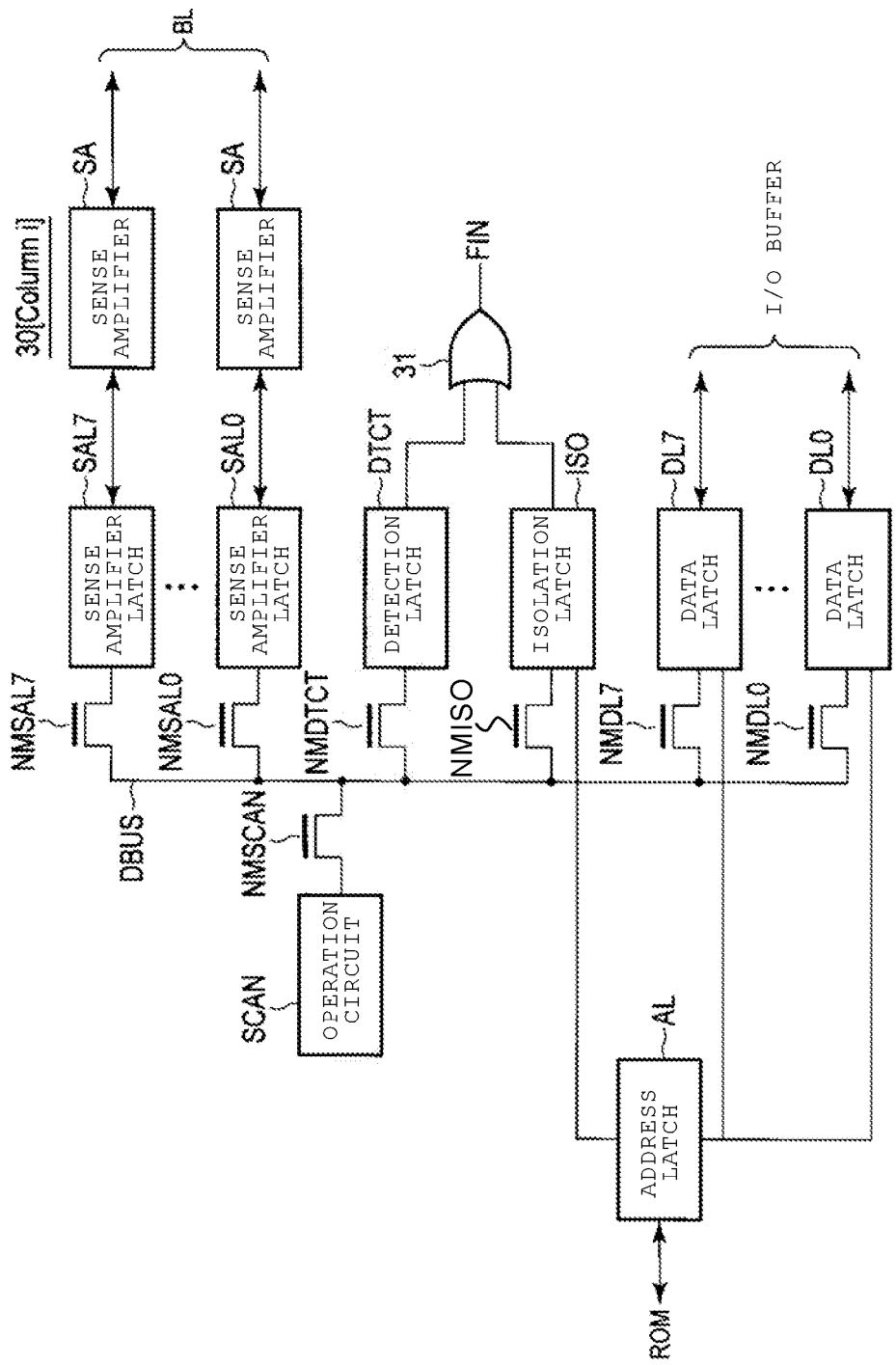
FIG. 6 is a diagram which shows a configuration of a sense amplifier circuit in each column according to a second embodiment.

As shown in FIG. 6, the second embodiment is different from the first embodiment in that the NMOS transistor NMISO which forms a current path is arranged between the isolation latch ISO and the data bus DBUS in the second embodiment.

That is, one of a source and a drain of the NMOS transistor NMISO is connected to the isolation latch ISO, and the other is connected to the data bus DBUS. Accordingly, a direct data exchange between the isolation latch ISO and the data latch DLm, between the isolation latch ISO and the detection latch DTCT, or between the isolation latch ISO and the operation circuit SCAN may be performed through the data bus DBUS.

The operation circuit SCAN performs a logical operation in various operations in the sense amplifier circuit 30. For example, the operation circuit SCAN performs a comparison operation of an expected value of the data latch DLm and data of the sense amplifier latch SALm in a test operation on whether or not a corresponding column is a defective column.

The isolation latch ISO cumulatively stores a result (defective information) of the logical operation by the operation circuit SCAN in the test operation on whether or not a corresponding column is a defective column.

The data latch DLm performs data-out of ISO information in the test operation on whether or not a corresponding column is a defective column. The ISO information is brought into comparison operation with an expected value "1". Accordingly, it is determined whether or not a corresponding column is a defective column.

Operation in Second Embodiment

A flow of a test operation of determining whether or not a corresponding column is a defective column is performed by a control of the controller 70.

Figure 7:
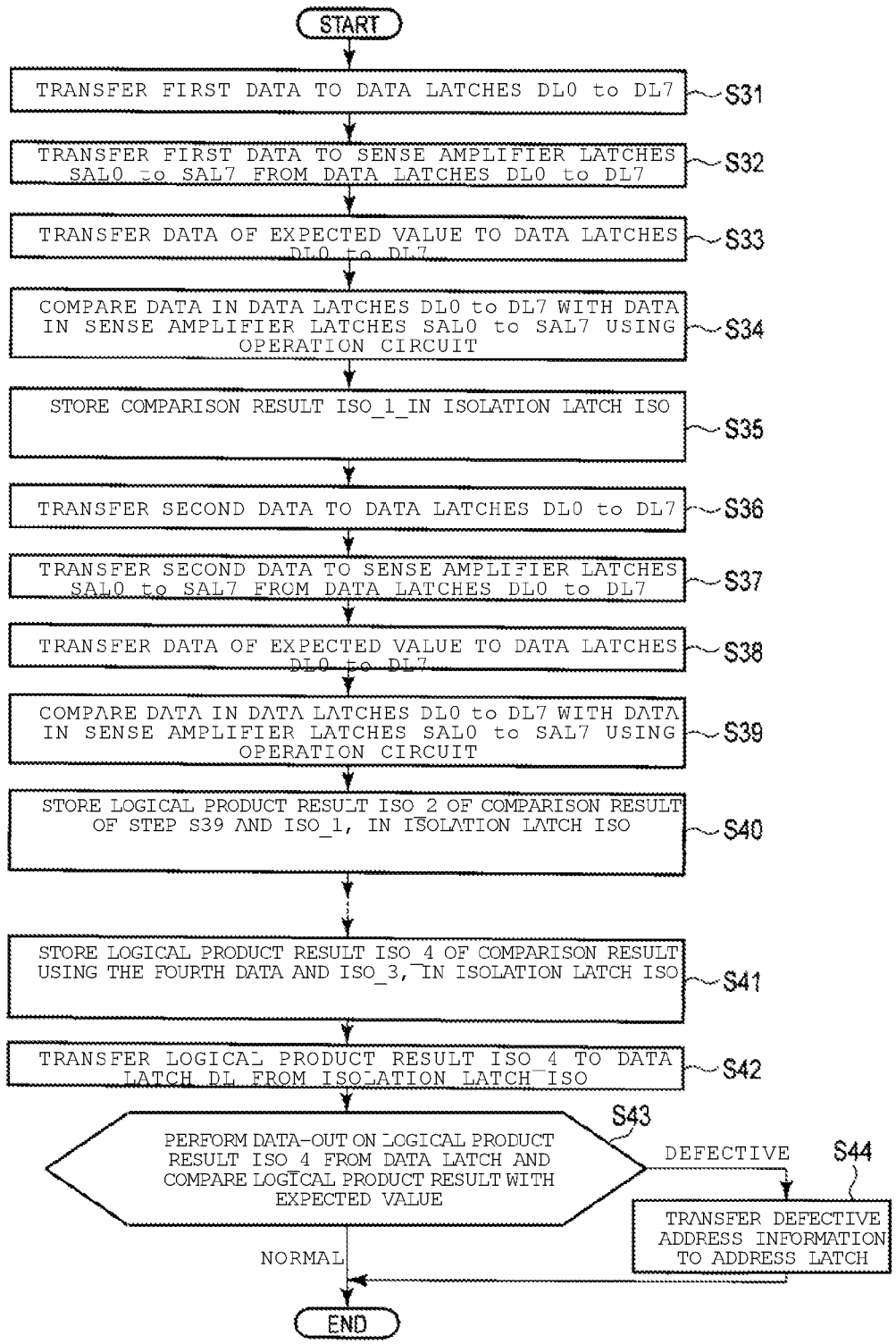
FIG. 7 is a flowchart which shows a test operation of a defective column according to the second embodiment.

FIG. 7 shows a test operation of determining whether or not there is a defect in the sense amplifier latch SALm in any column. A test operation on whether or not there is a defect in the sense amplifier SAm, the bit line BL, or the memory cell may be also performed in the same manner.

As shown in FIG. 7, in Step S31, the controller 70 transfers first data to the data latch DLm from the outside through the I/O buffer 50_m. The first data tests whether or not a transfer of, for example, the "0" data is possible, and is data containing "0000_0000". That is, the "0" data is transferred to each of the data latches DL0 to DL7.

Next, in Step S32, the controller 70 transfers data to the sense amplifier latch SALm from the data latch DLm through the data bus DBUS. At this time, the NMOS transistor NMDLm corresponding to the data latch DLm and the NMOS transistor NMSALm corresponding to the sense amplifier latch SALm are sequentially turned on according to a control of the controller 70.

Next, in Step S33, the controller 70 transfers data having an expected value to the data latch DLm from the outside through the I/O buffer 50_m. The data having an expected value is data the same as the first data transferred to the data latch DLm, and is data containing "0000_0000".

Next, in Step S34, the controller 70 performs a comparison operation on data in the data latch DLm and data in the sense amplifier latch SALm using the operation circuit SCAN. More specifically, a logical operation (DLm X SALm+/DLm X/SALm) is performed using the operation circuit SCAN. Here, DLm shows an expected value of the data latch DLm, and SALm shows data of the sense amplifier latch SALm, /DLm shows an inverted expected value of the data latch DLm, and SALm shows inverted data of the sense amplifier latch SALm. When the logical operation result is "1", the sense amplifier latch SALm is determined to be normal, and when the logical operation result is "0", the sense amplifier latch SALm is determined to be defective. That is, the sense amplifier latch SALm is determined to be normal when the first data transferred to the sense amplifier latch SALm remains as it is, and the sense amplifier latch SALm is determined to be defective when the first data is inverted.

During Step S34, according to a control of the controller 70, an NMOS transistor NMSCAN is turned on, and the NMOS transistor NMDLm corresponding to the data latch DLm and the NMOS transistor NMSALm corresponding to the sense amplifier latch SALm are sequentially turned on.

Next, in Step S35, the controller 70 causes a comparison result, ISO_1, to be stored in the isolation latch ISO. That is, when any of the sense amplifier latches SAL0 to SAL7 is determined to be defective, "0" is stored in the isolation latch ISO as ISO_1, and when all are determined to be normal, "1" is stored in the isolation latch ISO as ISO_1. At this time, according to a control of the controller 70, the NMOS transistors NMSCAN and NMISO are turned on.

Next, in Step S36, the controller 70 transfers second data to the data latch DLm from the outside through the I/O buffer 50_m. The second data is data which tests whether or not a transfer of, for example, the "1" data is possible, and is data containing "1111_1111". That is, the "1" data is transferred to all of the data latches DL0 to DL7.

Next, in Step S37, the controller 70 transfers data to the sense amplifier latch SALm from the data latch DLm through the data bus DBUS. At this time, the NMOS transistor NMLDm corresponding to the data latch DLm and the NMOS transistor NMSALm corresponding to the sense amplifier latch SALm are sequentially turned on according to a control of the controller 70.

Next, in Step S38, the controller 70 transfers data having an expected value to the data latch DLm from the outside through the I/O buffer 50_0. The data having an expected data is the same as the second data transferred to the data latch DLm, and is data containing "1111_1111".

Next, in Step S39, the controller 70 performs a comparison operation on the data in the data latch DLm and the data in the sense amplifier latch SALm using the operation circuit SCAN. The comparison operation is an operation the same as in Step S34. During Step S39, according to a control of the controller 70, the NMOS transistor NMSCAN is turned on, and the NMOS transistor NMDLm corresponding to the data latch DLm and the NMOS transistor NMSALm corresponding to the sense amplifier latch SALm are sequentially turned on.

Next, in Step S40, the controller 70 causes a logical product (AND operation) result of a comparison result of Step S39 and the comparison result of Step S34, ISO_1, to be stored in the isolation latch ISO as ISO_2. The logical product is obtained using the operation circuit SCAN. That is, when any of tests using the first data and the second data is defective, "0" is stored in the isolation latch ISO as ISO_2, and when all the tests are normal, "1" is stored in the isolation latch ISO as ISO_2. At this time, the NMOS transistors NMSCAN and NMISO are turned on according to a control of the controller 70.

Thereafter, although not shown, a test is performed using third data. The third data tests whether or not a transfer of the "1" data is possible after the transfer of, for example, the "0" data, and contains "0101_0101". That is, the "0" data is transferred to data latches DL0, DL2, DL4, and DL6, and the "1" data is transferred to data latches DL1, DL3, DL5, and DL7. Then, a logical product result of a comparison result using the third data and ISO_2, is stored in the isolation latch ISO as ISO_3.

Furthermore, a test is performed using fourth data. The fourth data tests whether or not a transfer of the "0" data is possible after the transfer of, for example, the "1" data, and is data made of "1010_1010". That is, the "1" data is transferred to the data latches DL0, DL2, DL4, and DL6, and the "0" data is transferred to the data latches DL1, DL3, DL5, and DL7. Then, in Step S41, a logical product result of a comparison result using the fourth data and ISO_3, is stored in the isolation latch ISO as ISO_4.

That is, the logical product result ISO_4 is a cumulative result of tests using the first data to the fourth data. The logical product result ISO_4 is stored in the isolation latch ISO as "0" when any of the tests using the first data to the fourth data is defective, and the logical product result is stored in the isolation latch ISO as "1" when all the tests are normal.

Next, in Step S42, the isolation latch ISO transfers the logical product result ISO_4 to each of the data latches DLm. At this time, the NMOS transistors NMISO and NMDLm are turned on.

Next, in Step S43, the controller 70 performs data-out on the logical product result ISO_4 from the data latch DLm, and performs a comparison operation on the logical product result ISO_4 with an expected value of "1". This comparison operation is the same as a comparison operation using the operation circuit SCAN. When the comparison operation is "1", a corresponding column is determined to be a normal column. On the other hand, when the comparison operation is "0", a corresponding column is determined to be a defective column, and defective address information is stored in the address latch AL in Step S44.

In this manner, a test operation of a defective column in the second embodiment is performed.

In the example, a result of a comparison operation is cumulatively stored in the isolation latch ISO is shown, but the invention is not limited thereto. The result of a comparison operation may be stored in the isolation latch ISO after being cumulatively stored in the detection latch DTCT.

In addition, the test operation of determining whether or not there is a defect in the sense amplifier latch SALm is shown in the example, but a test operation on whether or not there is a defect in the sense amplifier SAm, the bit line BL, or the memory cell may be performed in the same manner. For example, data for a test (the first to fourth data) are transferred from the sense amplifier latch SALm to the sense amplifier SAm, the bit line BL, or the memory cell, and then are transferred to the sense amplifier latch SALm, whereby these test operations may be performed.

Effects According to Second Embodiment

Figure 8:
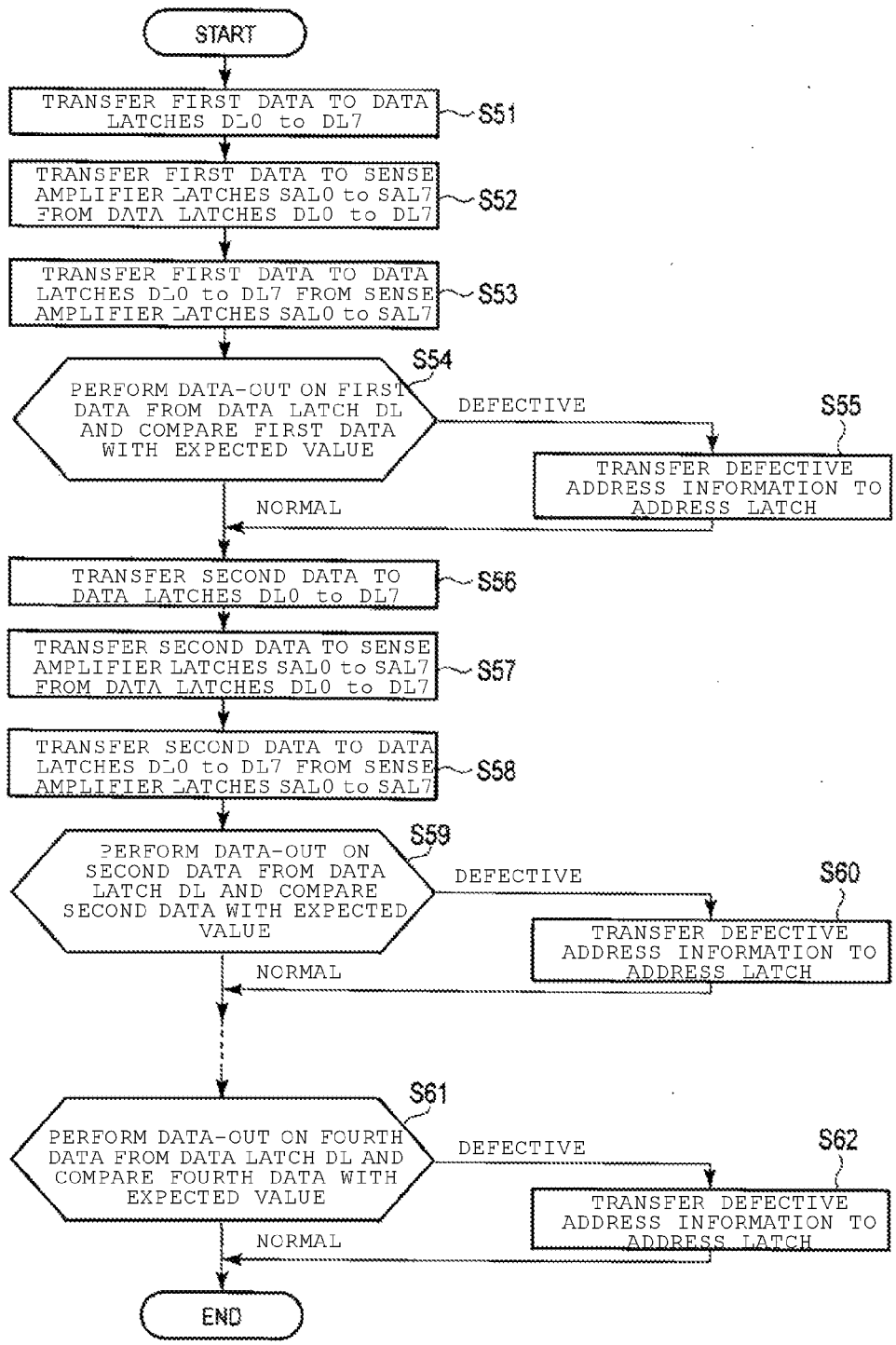
FIG. 8 is a flowchart which shows a test operation of a defective column according to a comparative example.

As shown in FIG. 8, in the same manner as in the second embodiment, the controller 70 transfers the first data to the data latch DLm from the outside through the I/O buffer 50_m in Step S51, and transfers the first data to the sense amplifier latch SALm from the data latch DLm through the data bus DBUS in Step S52 in a comparative example.

Next, in Step S53, the controller 70 transfers the first data to the data latch DLm from the sense amplifier latch SALm through a data bus DBUS.

Next, in Step S54, the controller 70 performs data-out on the first data from the data latch DLm, and performs a comparison operation on the data having an expected value. The data having the expected value is the same as the first data transferred to the data latch DLm. When the comparison operation is "1", a test of the first data is determined to be normal. On the other hand, when the comparison operation is "0", the test of the first data is determined to be defective, and defective address information is stored in the address latch AL in Step S55.

Next, in the same manner as in the second embodiment, the controller 70 transfers the second data to the data latch DLm from the outside through the I/O buffer 50_m in Step S56, and transfers the second data to the sense amplifier latch SALm from the data latch DLm through the data bus DBUS in Step S57.

Next, in Step S58, the controller 70 transfers the second data to the data latch DLm from the sense amplifier latch SALm through the data bus DBUS.

Next, in Step S59, the controller 70 performs data-out on the second data from the data latch DLm, and performs a comparison operation on the data with an expected value. The data having the expected value is same data as the second data transferred to the data latch DLm. When the comparison operation is "1", a test of the second data is determined to be normal. On the other hand, when the comparison operation is "0", the test of the second data is determined to be defective, and defective address information is stored in the address latch AL in Step S60.

Thereafter, although not shown, a test is performed using the third data. That is, the third data is sequentially transferred to the data latch DLm, the sense amplifier latch SALm, and then back to the data latch DLm. Then, the controller 70 performs data-out on the third data from the data latch DLm, and performs a comparison operation against the data with an expected value.

Furthermore, a test is performed using the fourth data. That is, the fourth data is sequentially transferred to the data latch DLm, the sense amplifier latch SALm, and then back to the data latch DLm. Then, in Step S61, the controller 70 performs data-out on the fourth data from the data latch DLm, and performs a comparison operation against the data with an expected value. When the comparison operation is "1", a test of the fourth data is determined to be normal. On the other hand, when the comparison operation is "0", the test of the fourth data is determined to be defective, and defective address information is stored in the address latch AL in Step S62.

In this manner, a test operation of a defective column in a comparative example is performed. In the test operation of a defective column in a comparative example, data-out is performed and a comparison operation (Steps S54, S59, and S61) is performed in each test using each data item. Therefore, time for a test operation of a defective column becomes long.

In contrast, according to the second embodiment, the NMOS transistor NMISO is arranged. One of a source and a drain of the NMOS transistor NMISO is connected to the data bus DBUS, and the other is connected to the isolation latch ISO. That is, the isolation latch ISO is connected to the data bus DBUS through the NMOS transistor NMISO. Accordingly, a direct data exchange may be performed between the isolation latch ISO and the data latch DLm, between the isolation latch ISO and the detection latch DTCT, and between the isolation latch ISO and the operation circuit SCAN.

Accordingly, a test result using each data item may be accumulated in the isolation latch ISO to be stored in a test operation on whether or not there is a defective column. Therefore, there is no need to perform a test by performing data-out on each test of each data item. That is, in the second embodiment, all of the Steps S54, S59, and S61 in a comparative example are not necessary, and a test may be performed by performing one-time data-out on an accumulation result, whereby it is possible to greatly reduce time for the test operation.

In the second embodiment, an operation replacing Step S12 shown in FIG. 4 in the first embodiment is available. That is, the following operation is available so as to set a defective column to be in the non-selected state.

When a corresponding column is a defective column in a write operation, the "1" data is directly transferred to the data bus DBUS from the isolation latch ISO. Accordingly, in the same manner as in the first embodiment, it is possible to set the column to be in the non-selected state.

Alternatively, the OR operation is performed on data of the data latch DLm and data (defective column information) of the isolation latch ISO using the operation circuit SCAN. Then, a result of the operation is transferred to the sense amplifier latch SALm from the operation circuit SCAN. Accordingly, since the result of the operation is "1" when any of the data latch DLm and the isolation latch ISO has the "1" data, it is possible to set the sense amplifier latch SALm to be in the non-selected state.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a plurality of memory cells;
   a data bus connected to a first column of the memory cells, by which data is transferred to and from the memory cells of the first column;
   a data latch storing data indicating whether the first column is defective or not;
   a transistor having a first terminal connected to the data bus, and a second terminal connected to an output of the data latch, the transistor being turned on during a test operation to store data indicating whether or not the first column is defective or not;
   a plurality of sense amplifier latches connected between the first column of memory cells and the data bus; and
   an operation circuit configured to compare data stored in the sense amplifier latches with expected values to determine whether or not the first column is defective or not.

2. The device according to 1, wherein the test operation includes multiple test stages and at the conclusion of each test stage, an interim result indicating whether or not the first column is defective or not is stored in the data latch.

3. The device according to claim 1, wherein the transistor is turned on during a write operation if the first column is a defective column to transfer data from the data latch to the data bus.

4. The device according to claim 3,
wherein the sense amplifier latches each store data of a first type when electrically connected to the data bus when the data bus is at a high level and of a second type when electrically connected to the data bus when the data bus at a low level.

5. The device according to claim 4, wherein
when the data of the first type is stored in a sense amplifier latch, the memory cells connected thereto are not written, and
when the data of the second type is stored in a sense amplifier latch, the memory cells connected thereto are written.

6. The device according to claim 5, wherein the data of the first type is 1 and the data of the second type is 0.

7. The device according to claim 3, wherein the data stored in the data latch is 1 when the first column defective and 0 when the first column is not defective.

* * * * *